US006411164B1

(12) United States Patent
Enriquez

(10) Patent No.: US 6,411,164 B1
(45) Date of Patent: Jun. 25, 2002

(54) PRECISION LOW POWER OPERATIONAL AMPLIFIER WITH GAIN INVARIANT BANDWITH

(75) Inventor: Leonel Ernesto Enriquez, Melbourne Beach, FL (US)

(73) Assignee: Intersil Americas Inc., Irvine, CA (US)

( * ) Notice: Subject to any disclaimer, the term of this patent is extended or adjusted under 35 U.S.C. 154(b) by 0 days.

(21) Appl. No.: 09/901,265

(22) Filed: Jul. 9, 2001

Related U.S. Application Data

(63) Continuation-in-part of application No. 09/639,408, filed on Aug. 14, 2000.

(51) Int. Cl.[7] .................................................. H03F 3/45
(52) U.S. Cl. ........................................ 330/257; 330/260
(58) Field of Search .......................... 330/69, 252, 257, 330/260, 261

(56) References Cited

U.S. PATENT DOCUMENTS 5,410,274 A * 4/1995 Birdsall et al. ............... 330/69
6,154,094 A * 11/2000 Seven ........................ 330/257
6,259,322 B1 * 7/2001 Muza ......................... 330/257

FOREIGN PATENT DOCUMENTS

JP 408018398 A * 1/1996 ............. H03F/1/34

* cited by examiner

*Primary Examiner*—Robert Pascal
*Assistant Examiner*—Khanh Van Nguyen
(74) *Attorney, Agent, or Firm*—Allen, Dyer, Doppelt, Milbrath & Gilchrist, P.A.

(57) ABSTRACT

A precision, low power operational amplifier employs a transconductance amplifier architecture to provide wide operational bandwidth at any closed looped gain, and maintain DC precision. A single ended output node/port, to which current paths of first and second current mirrors of the transconductance amplifier are coupled serves as a 'non-inverting' terminal. The first and second current mirrors include additional current mirror stages whose outputs are coupled to respective third and fourth auxiliary current mirrors. The outputs of the third and fourth current mirrors are coupled to an 'inverting' terminal. An output amplifier stage has its non-inverting input coupled to ground and its inverting input coupled to a feedback port. A gain-defining feedback resistor is coupled between the output and the feedback port of the output amplifier stage. The functionality of the operational amplifier circuit is defined by selectively connecting the feedback port of the output amplifier stage to one of the non-inverting and inverting terminals, with the other of these two terminals being unconnected or open.

8 Claims, 3 Drawing Sheets

PRECISION LOW POWER OPERATIONAL AMPLIFIER WITH GAIN INVARIANT BANDWITH

CROSS REFERENCE TO RELATED APPLICATIONS

The present application is a continuation-in-part of my co-pending U.S. patent application, Ser. No. 09/639,408, entitled: "Transconductance Amplifier Circuit," filed Aug. 14, 2000 (hereinafter referred to as the '408 application), assigned to the assignee of the present application, and the disclosure of which is incorporated herein.

FIELD OF THE INVENTION

The present invention relates in general to communication systems and components, and is particularly directed to a new and improved precision, low power operational amplifier that employs a transconductance amplifier architecture of the type described in my above-referenced '408 application, and is configured to enjoy a wide operational bandwidth at any closed looped gain, while at the same time maintaining DC precision.

BACKGROUND OF THE INVENTION

As described in the above-referenced '408 application, the transmission channels of subscriber line interface circuits, or SLICs, employed by telecommunication service providers include a very demanding set of performance requirements, including accuracy, linearity, insensitivity to common mode signals, low power consumption, low noise, filtering, and ease of impedance matching programmability, to facilitate interfacing the SLIC with a variety of telecommunication circuits including those providing digital codec functionality. In a typical application, the length of the wireline pair to which a SLIC is connected can be expected to vary from installation to installation, may have a significant length (e.g., on the order of multiple miles), and is used to transport both substantial DC voltages, as well as AC signals (e.g., voice and/or ringing). As a consequence, it has been difficult to realize a SLIC implementation that has 'universal' use in both legacy and state of the art installations.

In accordance with the invention disclosed in the above-referenced '408 application, such shortcomings of conventional transconductance amplifier circuits are effectively obviated by a new and improved transconductance amplifier circuit architecture, a schematic diagram of a non-limiting bipolar transitor-based implementation of which is shown in FIG. 1, and which is configured to transform a single ended input voltage into a very precise, single ended output current, without requiring a substantial quiescent current, and in a manner which is effectively independent of (differential) voltage supply rails through which the circuit is powered.

In FIG. 1, the transconductance amplifier circuit is shown as including an operational amplifier configured as a unity gain buffer 100. The operational amplifier has a dual polarity input operational amplifier input and gain stage 110, and a low output impedance, single ended output stage 120. The input and gain stage 110, which may have a conventional high impedance, moderate voltage gain circuit configuration, has a first, non-inverting polarity input 111, that is adapted to be coupled to a DC reference voltage, shown as a voltage v0 (relative to ground (GND)) , and a second, inverting polarity input 112, which is adapted to track the voltage v0. The input voltage v0 can be selected in compliance with the overhead voltages and power dissipation required by the specific application in which the transconductance amplifier circuit is employed.

The output stage 120 includes a differentially coupled transistor circuit pair, having a first, diode-connected NPN transistor 130, whose collector 131 and base 132 are connected in common to a first polarity output port 113 of the amplifier's input stage 110. The emitter 133 of transistor 130 is coupled in common to the emitter 143 of a second, diode-connected PNP transistor 140. In a complementary fashion, PNP transistor 140 has its collector 141 and base 142 connected in common to a second polarity output port 114 of the amplifier input stage 110. The base 132 of NPN transistor 130 is coupled n common with the base 152 of an NPN transistor 150, the emitter 153 of which is coupled in common to the emitter 163 of a PNP transistor 160 and to an input/output node 123 of output stage 120.

The PNP transistor 160 has its base 162 coupled in common with the base 142 of the PNP transistor 140. The output stage has an input/output node 123 coupled in a follower configuration over a negative feedback path 126 to the inverting input 112 of the input stage 110. Unlike a conventional amplifier circuit, the input/output node 123, rather than being employed to supply an output current to a downstream load, is coupled to receive one or more input currents, respectively supplied through one or more coupling resistors, to associated voltage feed ports. In order to reduce the complexity of the drawing FIG. 1 shows a single input-coupling resistor R1 coupled between node 123 and an input port 125. With a voltage Vin applied to the input port 125, a current Iin will flow through input resistor R1.

The series-connected, collector-emitter current paths through the output transistors 150 and 160 of the amplifier's output stage 120, rather than being biased via a direct coupling to respective (Vcc and Vee) voltage supply rails 155 and 156, are coupled in circuit with first current supply paths 171 and 181 of first and second current mirror circuits 170 and 180, respectively. These current mirror circuits serve to isolate the biasing of the amplifier's output stage 120 from its power supply terminals, so that the output current produced at a single ended output node/port 135 can be accurately controlled independent of the values of the power supply voltages.

The current mirror circuit 170 includes a first PNP transistor 200 having its emitter 203 coupled to the (Vcc) voltage supply rail 155, and its base 202 coupled in common with the base 212 and collector 211 of a diode-connected current mirror PNP transistor 210, the emitter 213 of which is coupled to (Vcc) voltage supply rail 155. The current mirror transistor 200 supplies a mirrored output current to the current supply path 172 as a prescribed factor K of the current received by transistor 210 over the current supply path 171, in accordance with the ratio (1:K) of the geometries of the transistors 210/200. The collector 211 and base 212 of transistor 210 are coupled over the first current supply path 171 of the current mirror 170 to the collector 151 of transistor 150 of the output stage 120. The collector 201 of transistor 200 is coupled over a second current supply path 172 of the current mirror 170 to the transconductance stage's single ended output node/ port 135.

The current mirror circuit 180 includes a first NPN transistor 220 having its emitter 223 coupled to the (Vee) voltage supply rail 156 and its base 222 coupled in common with the base 232 and collector 231 of a diode-connected current mirror NPN transistor 230, whose emitter 233 is coupled to (Vee) voltage supply rail 156. The collector 231 and base 232 of the current mirror transistor 230 are coupled over the first current supply path 181 of the current mirror 180 to the collector 161 of output stage transistor 160. The collector 221 of transistor 220 is coupled over a second current supply path 182 of the current mirror 180 to the output node 135. The current mirror transistor 220 provides a mirrored output current to current supply path 182 as a factor K of the current received by transistor 230 over current supply path 181, in accordance with the (1:K) ratio of the geometries of transistors 230/220.

An examination of current node equations (set forth below), that define the transfer function of the transconductance amplifier circuit of FIG. 1, reveals that it has a very wide dynamic range and is capable of accommodating single or multiple, differential polarity voltages applied at its one or more voltage feed ports. This wide dynamic range is obtained at a very low quiescent power dissipation.

More particularly, the single ended output current $i_{123}$ delivered to input/output node 123 may be defined in equation (1) as:

$$i_{123}=(v_{125-1}-v_{111})/R_1 \quad (1)$$

The currents $i_{171}$ and $i_{181}$ supplied to current mirrors 170 and 180 may be related to the current $i_{123}$ at the input/output node 123 by equation (2) as:

$$i_{123}+i_{171}=i_{181}=\rightarrow i_{123}=i_{181}-i_{171} \quad (2)$$

The currents $i_{172}$ and $i_{182}$ supplied by current mirrors 170 and 180 may be related to the current $i_{135}$ at the output node 135 by equation (3):

$$i_{172}+i_{135}=i_{182} \quad (3)$$

and equation (4) as:

$$Ki_{171}+i_{135}=Ki_{181}=\rightarrow i_{out}=i_{135}=K(i_{181}-i_{171})=Ki_{123} \quad (4)$$

Substituting equation (1) into equation (4) yields equation (5) as:

$$i_{out}=K(v_{125}=v_{111})/R_1 \quad (5)$$

Equations (2) and (4) imply that transistor limitations due to beta and early voltage are compensated or minimized (in a manner not specifically shown in the diagrammatic illustration of FIG. 1). It may also be noted that if transistors 130/150 and 140/160 are matched pairs and the time average value of the input voltage is equal to zero, then the time average values of currents $i_{171}$ and $i_{181}$ are equal to the DC bias current $I_{DC}$ flowing in the emitter path of the output stage transistors 130-140. As a consequence, if the value of the bias current $I_{DC}$ is relatively low and the current mirror ratio K is equal to or less than 1, the quiescent power consumed by the transconductance amplifier circuit can be reduced to a very small value.

As described above, a particularly useful application of the transconductance amplifier circuit of FIG. 1 is a building block for one or more subcircuits, such as but not limited to those employed within a subscriber line interface circuit, or SLIC.

SUMMARY OF THE INVENTION

In accordance with the present invention, the transconductance amplifier circuit of my above-referenced '408 application and shown in FIG. 1 described above, is used to realize a new and improved, precision, low power operational amplifier circuit having a wide operational bandwidth at any closed looped gain, while at the same time maintaining DC precision. This achieves a dual functionality not available from a conventional voltage feedback design, which exhibits an undesirable reduction in bandwidth as its closed loop gain increases, and a conventional current feedback design which, although not suffering from a reduction in bandwidth as does a voltage feedback design, lacks DC precision.

To this end, the single ended output node/port, to which the current paths of the first and second current mirrors of the transconductance amplifier architecture described above are coupled, is employed as a non-inverting terminal, and is coupled through a pair of complementary polarity oriented diodes to a reference terminal (e.g., ground). In addition, each of the first and second current mirror circuits includes an additional current mirror stage whose outputs are coupled to respective third and fourth auxiliary current mirror stages. The outputs of the third and fourth current mirrors are coupled in common to a further single ended 'inverting' output node/port, that is employed as an inverting terminal. Like the non-inverting terminal, the inverting input terminal is coupled through a pair of complementary polarity oriented diodes to a reference terminal (e.g., ground).

An output operational amplifier stage has its non-inverting input coupled to ground and its inverting input coupled to a feedback port. A gain-defining feedback resistor is coupled between the output and the feedback port of the output operational amplifier stage. The functionality of the operational amplifier circuit of the present invention is defined by selectively connecting the feedback port of the output amplifier stage to one of the non-inverting terminal and the inverting terminal, with the other of these two terminals being unconnected or open. The closed loop gain is the ratio of the gain-defining feedback resistor of the output amplifier stage and the input resistor to the transconductance amplifier stage.

DETAILED DESCRIPTION

Figure 1:
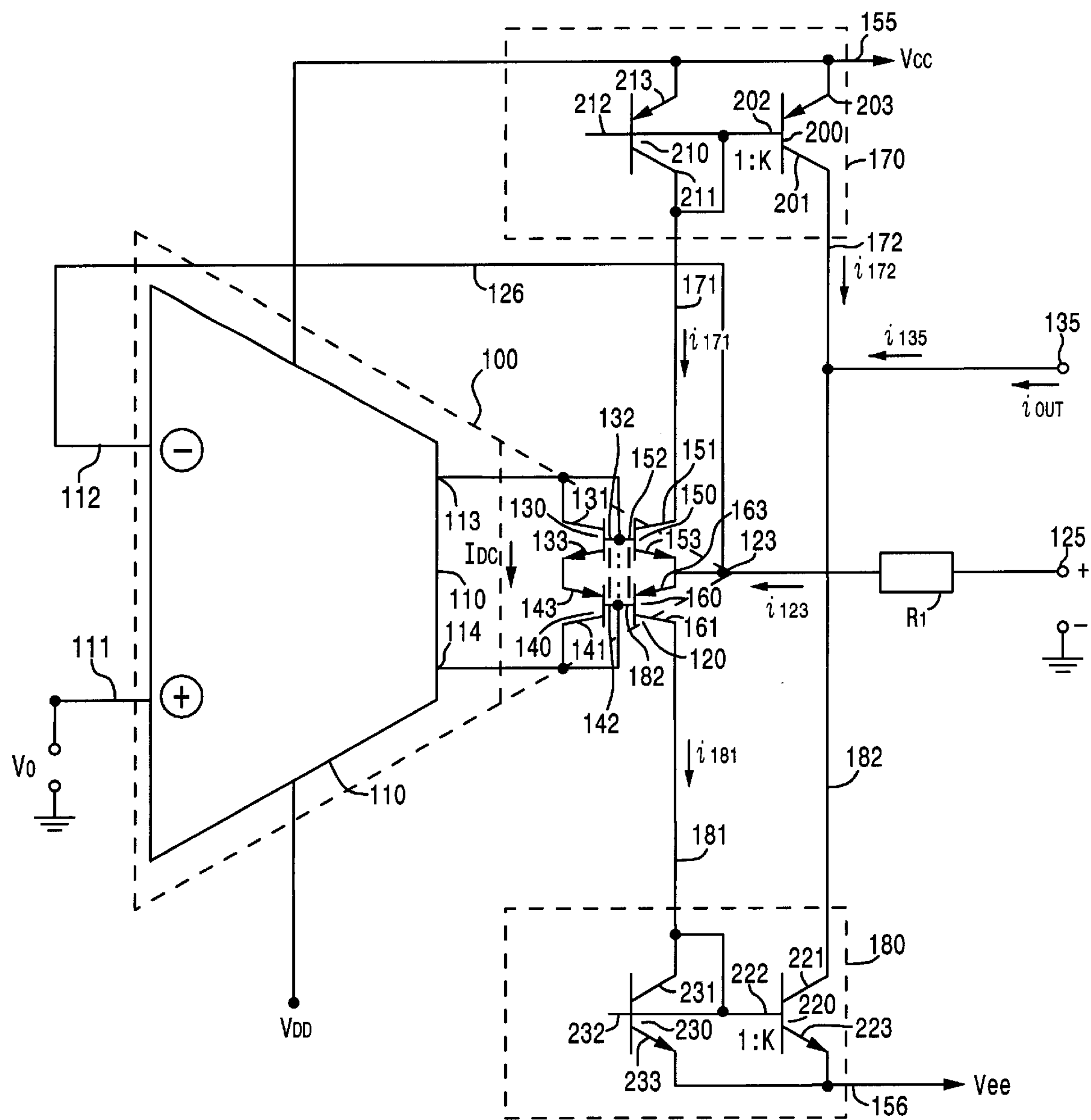
FIG. 1 schematically shows a transconductance amplifier circuit in accordance with the invention disclosed in the above-referenced '408 application.
Figure 2:
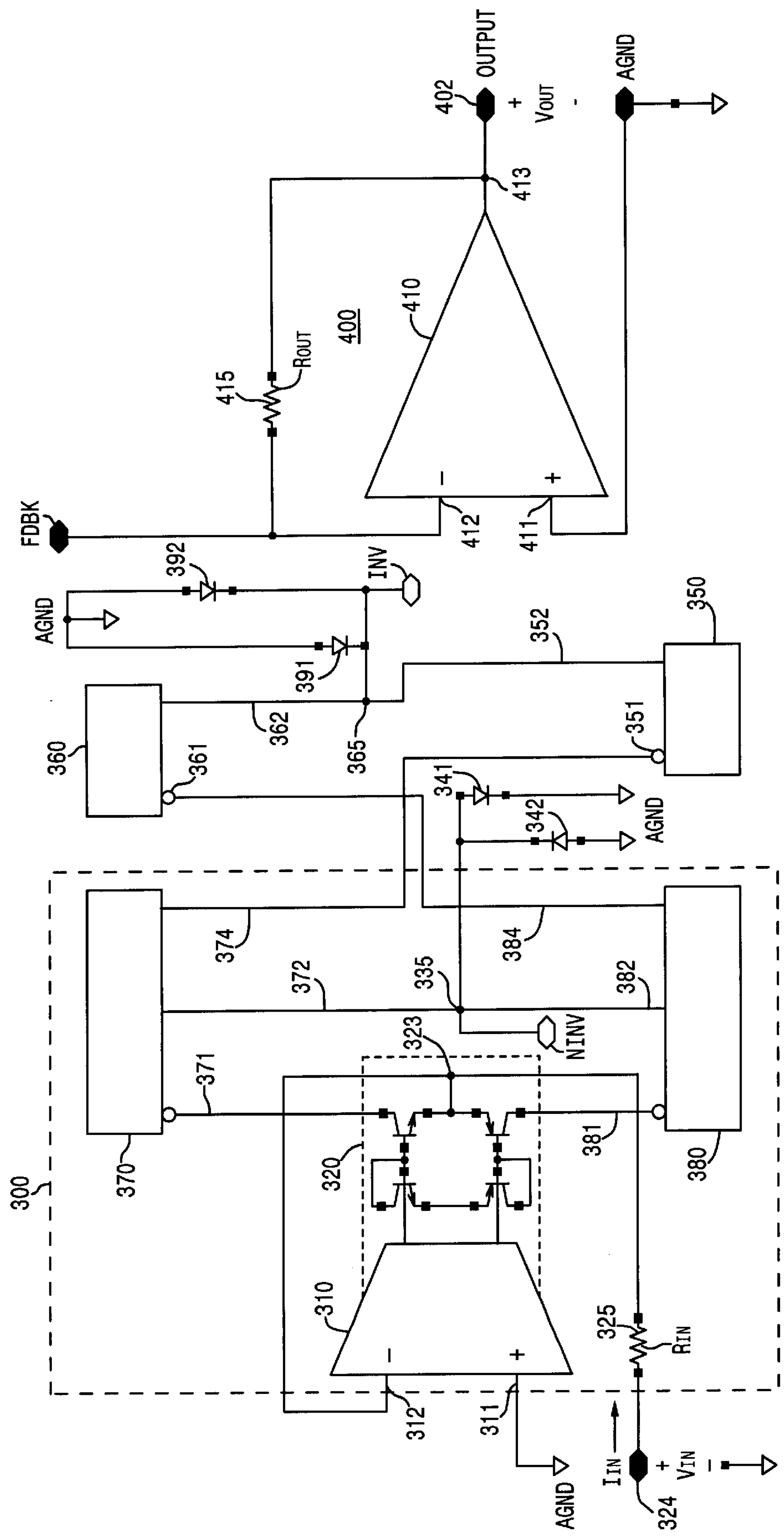
FIG. 2 diagrammatically illustrates a transconductance amplifier-based, precision, low power operational amplifier in accordance with the present invention.

The overall architecture of the transconductance amplifier-based, precision, low power operational amplifier of the invention is diagrammatically illustrated in FIG. 2 as comprising a front end, transconductance amplifier stage 300, the configuration of which corresponds to that of the transconductance amplifier circuit of FIG. 1. As described above, and as shown in FIG. 2, the front end, transconductance amplifier stage 300 includes a unity gain buffer operational amplifier having a dual polarity input operational amplifier input and gain stage 310 and a low output impedance, single ended output stage 320. These two stages are configured the same as respective stages 110 and 120 of the transconductance amplifier of FIG. 1, so that a description thereof will not be repeated here. The input and gain stage 310 has a first, non-inverting polarity (+) input 311 coupled to a prescribed DC voltage (e.g., ground (GND)). The low impedance output stage 320 has its input/output node 323 coupled to the second, inverting polarity (–) input 312 of the input gain stage 310, and through an input resistor

325 having value Rin to an input port 324, to which an input voltage Vin is coupled.

Also, like the transconductance amplifier of FIG. 1, the transconductance amplifier-based architecture of FIG. 2 has its low impedance output stage 320 coupled to a pair of current mirror circuits 370 and 380, which isolate the biasing of the amplifier's output stage from its power supply terminals, and have current supply paths 372 and 382 thereof coupled in common to a node 335, which corresponds to the single ended node 135 of FIG. 1 and is coupled to a first 'non-inverting' input port or terminal NINV. As will be described, depending upon intended amplifier operation, either this first, 'non-inverting' input NINV, or a second, 'inverting' input terminal INV is coupled to a feedback port FDBK of a downstream operational amplifier stage 400. The node 335 is further coupled in common to a first pair of rectifier elements (diodes) 341 and 342 that are coupled in complementary polarity directions to ground.

In addition to having their common node 335 coupled to the non-inverting input terminal NINV, each of the current mirror circuits 370 and 380 includes an additional current mirror output transistor, from which a respective copy of the mirrored current of the current supply path 372, 382 is supplied. In FIG. 2, these additional mirrored copies of the mirrored currents of the current mirror output paths 372 and 382 are supplied over first and second additional mirror current supply paths 374 and 384, respectively.

The first additional mirror current supply path 374 is coupled to an input 351 of a first auxiliary current mirror stage 350; the second additional mirror current supply path 384 is coupled to an input 361 of a second auxiliary current mirror stage 360. The auxiliary current mirror stages 350 and 360 have respective outputs 352 and 362 thereof coupled in common to a node 365, which is coupled through a second pair of rectifier elements (diodes) 391 and 392 connected in complementary polarity directions to ground. Node 365 is coupled to a second 'inverting' input port or terminal INV.

As pointed out above in connection with the description of the properties and operation of the transconductance amplifier circuit of FIG. 1, with the transistors of the stage low impedance output stage 320 being matched pairs and the time average value of the input voltage Vin is zero, then the time average values of current $i_{371}$ flowing in current path 371 and current $i_{381}$ flowing in current path 381 are equal to a DC bias current $I_0$ flowing in the emitter path to node 323 of the transistors of the output stage 320. Namely, for Iin=0, $$I_0=I_{371}=I_{372} \tag{5}$$

As a result, with the value of the bias current $I_0$ being relatively low and the current mirror ratio K being equal to or less than 1, the quiescent power consumed by the transconductance amplifier circuit can be reduced to a very small value.

In addition, the geometries of the components of the current mirrors are preferably the same, so that the following current mirror relationships may be defined.

$$I_{381}=I_{382}=I_{361}=I_{362} \tag{6}$$

$$I_{371}=I_{372}=I_{374}=I_{352} \tag{7}$$

The output amplifier stage 400 contains an operational amplifier 410 having its non-inverting (+) input 411 coupled to a prescribed reference voltage (here GND) and its inverting (−) input 412 coupled to the feedback terminal FDBK. The operational amplifier 410 has its output 413 coupled to an output terminal (OUTPUT) 402 and through a feedback resistor 415 (having a value Rout) to its inverting (−) input 412, to which the feedback terminal FDBK is coupled.

The effect of the selective connection of the feedback node FDBK to one of the respective inverting and non-inverting ports NINV and INV may be readily understood from an examination of the relationships among the currents of equations (6) and (7) with the currents and the nodes NINV and INV.

For the input terminal 324, the input current Iin coupled through the input resistor 325 is applied to node 323, for which the following node equation (8) may be defined:

$$Iin+I_{371}=I_{381} \tag{8}$$

Similarly, for the non-inverting input terminal NINV, the input current $I_{NINV}$, is applied to node 335, for which the following node equation (9) may be defined:

$$I_{NINV}+I_{372}=I_{382} \tag{9}$$

For the inverting input terminal INV, the input current $I_{INV}$ is applied to node 365, for which the following node equation (10) may be defined:

$$I_{362}=I_{INV}+I_{352} \tag{10}$$

Equations (8), (9) and (10) may be respectively rewritten as follows:

$$Iin=I_{381}-I_{371} \tag{11}$$

$$I_{NINV}=I_{382}-I_{372} \quad \text{(12), and}$$

$$I_{INV}=I_{352}-I_{362} \tag{13}$$

Substituting from the current equalities of equations (6) and (7), equation (13) becomes:

$$I_{INV}=I_{381}-I_{371} \tag{14}$$

and equation (12) becomes $$I_{NINV}=I_{382}-I_{372} \tag{15}$$

or $$I_{NINV}=I_{INV} \tag{16}$$

Namely, the currents $I_{NINV}$ and $I_{INV}$ are of equal magnitude and flow in mutually opposite directions relative to their associated terminals NINV and INV, respectively.

Figure 3:
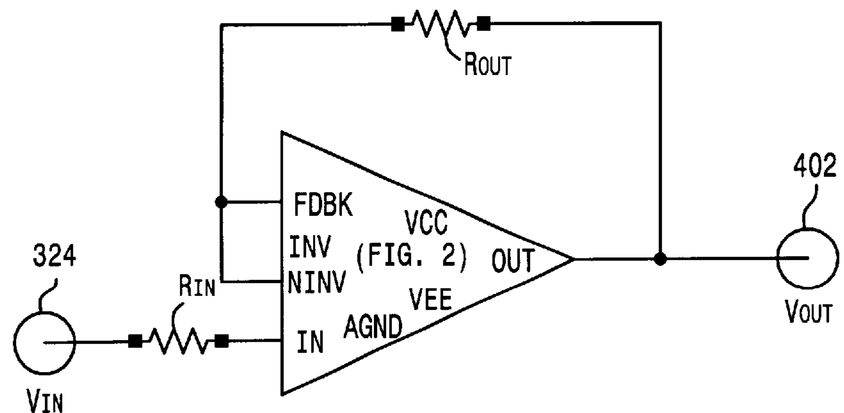
FIG. 3 shows the non-inverting connectivity of the amplifier circuit architecture of FIG. 2, with the non-inverting terminal NINV being coupled to the feedback port FDBK of the output amplifier stage, while the inverting terminal INV is open or unconnected.

FIG. 3 shows the non-inverting connectivity of the amplifier circuit architecture of FIG. 2, with the non-inverting terminal NINV being coupled to the feedback port FDBK of the output amplifier stage 400, while the inverting terminal INV is open. In this non-inverting configuration, the output voltage Vout at the output terminal OUTPUT may be defined as:

$$Vout=I_{NINV}*R_{325}Iin*Rin \tag{17}$$

Because of the follower configuration of the transconductance amplifier stage 300, the input current Iin is defined as:

$$Iin=Vin/Rin \tag{18}$$

so that $$Vout=(Rout/Rin)*Vin \tag{19}$$

Thus, the closed loop gain is $$Rout/Rin \tag{20}$$

Figure 4:
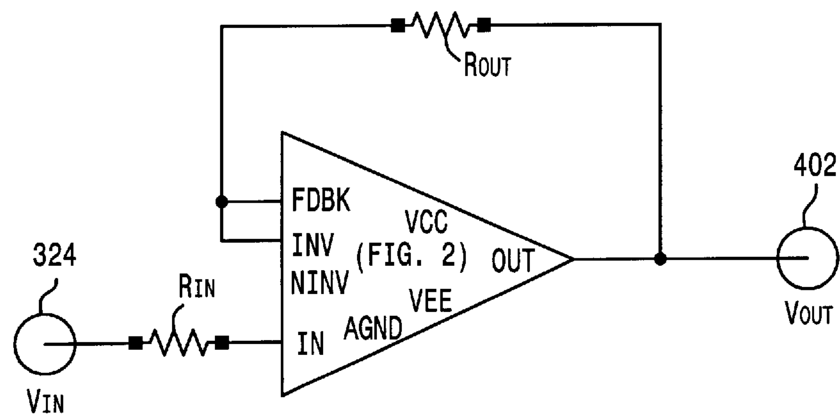
FIG. 4 shows the inverting connectivity of the amplifier circuit architecture of FIG. 2, with the inverting terminal INV being coupled to the feedback port FDBK of the output amplifier stage, while the non-inverting terminal NINV is open.

FIG. 4 shows the inverting connectivity of the amplifier circuit architecture of FIG. 2, in which the inverting terminal INV is coupled to the feedback port FDBK of the output amplifier stage 400, while the non-inverting terminal INV is open. In this inverting configuration, the output voltage Vout at the output terminal OUTPUT may be defined as:

$$Vout=-I_{INV}*R_{325}=-Iin*Rin \quad (21).$$

From equation (18), $$Vout=-(Rout/Rin)*Vin \quad (12),$$

so that the closed loop gain is $$-Rout/Rin \quad (22).$$

As may be noted from equation (1), plural input signals may be coupled through associated input resistors to the input terminal 125. In this case, the output will be the sum of all of the input signals times the gain defined by the ratio of the feedback resistor Rout to the effective resistance of the input resistors. Such a non-inverting 'adder' configuration cannot be implemented with a single conventional amplifier.

Figure 5:
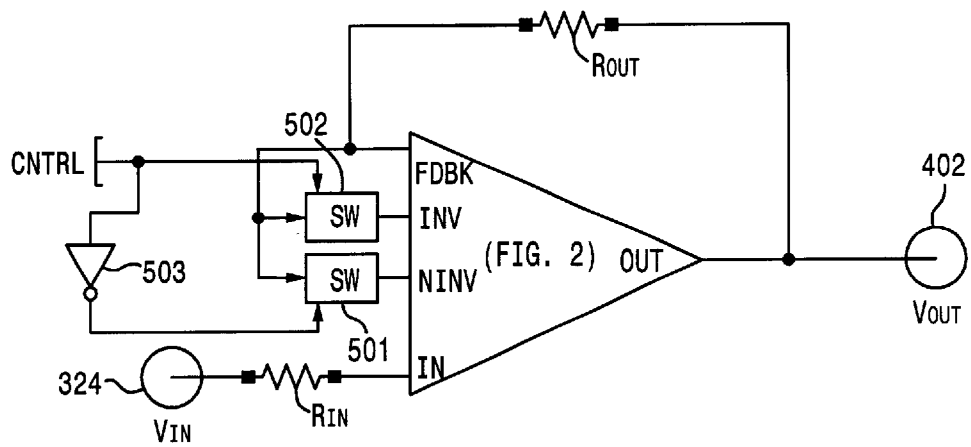
FIG. 5 diagrammatically illustrates an augmentation of the circuit of FIG. 2 that facilitates the ability to digitally program its functionality as either of the inverting or non-inverting circuits of FIGS. 3 and 4.

FIG. 5 diagrammatically illustrates an augmentation of the circuit of FIG. 2 that facilitates the ability to digitally program its functionality as either of the inverting or non-inverting circuits of FIGS. 3 and 4. In FIG. 5, a first switch 501 is coupled between the feedback port FDBK and the non-inverting terminal NINV, and a second switch 501 is coupled between the feedback port FDBK and the inverting terminal INV. An inverter 503 is coupled between a digital control terminal CNTL and the switch control inputs of the switches. Depending upon the logical state of the signal applied to control terminal CNTL the feedback port will be coupled to one or the other of the terminals NINV and INV, in accordance with the intended mode of operation described above.

It will be appreciated that both amplifier stages 300 and 400 remain in a unity gain follower configuration irrespective of the values of the input and feedback resistors employed. As a result, the overall bandwidth of the amplifier is effectively insensitive to the chosen closed loop gain within the limitations dictated by parasitic reactances.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein, but intend to cover all such changes and modifications as are obvious to one of ordinary skill in the art.

What is claimed is:

1. An amplifier circuit comprising:

a transconductance amplifier gain stage including an operational amplifier configured as a unity gain buffer and an oatput stage having an input/output port coupled via a negative feedback path to a first, inverting input of said operational amplifier, a second, non-inverting input of said operational amplifier being coupled to a reference voltage, said input/output port being coupled through an input resistor to a signal input port;

first and second current mirror circuits coupled to said output stage of said transconductance amplifier gain stage and having first and second current output ports thereof coupled to a first node, and third and fourth current output ports thereof coupled to third and fourth current mirror circuits, said third and fourth current mirror circuits having fifth and sixth current output ports thereof coupled to a second node; and an output amplifier stage from which an output is derived, said output amplifier stage having a feedback resistor coupled between an input port thereof and a signal output port; and wherein one of said first and second nodes is coupled to said input port of said output amplifier stage.

2. The amplifier circuit according to claim 1, wherein said transconductance amplifier gain stage comprises a differentially coupled transistor circuit pair having a current flow path therethrough coupled to a first current path between said first and second current mirror circuits, and a common node coupled to said input/output port.

3. The amplifier circuit according to claim 1, wherein said first node is coupled to said input port of said output amplifier stage, and said second node is open.

4. The amplifier circuit according to claim 1, wherein said second node is coupled to said input port of said output amplifier stage, and said first node is open.

5. A amplifier circuit comprising:

an operational amplifier having a non-inverting input, and an inverting input, and including an output stage cooupled in a first current flow path between a first current mirror circuit coupled to a first voltage supply and a second current mirror circuit coupled to a second voltage supply, said output stage having an input/output port coupled by way of a feedback path to said inverting input of said operational amplifier, said input/output port being coupled through an input resistor to a signal input port, said first and second current mirror circuits having first and second current output ports thereof coupled to a first current output node, and third and fourth current output ports;

third and fourth current mirror circuits respectively coupled to mirror currents, produced at said third and fourth outputs of said first and second current mirror circuits, at fifth and sixth current output ports thereof, which are coupled to a second current output node;

an output amplifier stage from which an output is derived, said output amplifier stage having a feedback resistor coupled between an input port thereof and a signal output port; and wherein one of said first and second current output nodes is coupled to said input port of said output amplifier stage, End the other of said first and second current output nodes is open.

6. The amplifier circuit according to claim 5, wherein said transconductance amplifier gain stage comprises a differentially coupled transistor circuit pair having a current flow path therethrough coupled to a first current path between said first and second current mirror circuits, and a common node coupled to said input/output port.

7. The amplifier circuit according to claim 5, wherein said first current output node is coupled to said input port of said output amplifier stage, and said second current output node is open.

8. The amplifier circuit according to claim 5, wherein said second current output node is coupled to said input port of said output amplifier stage, and said first current output node is open.

* * * * *